United States Patent
Khalil et al.

(10) Patent No.: US 9,800,213 B1
(45) Date of Patent: Oct. 24, 2017

(54) AMPLIFIER DEVICES WITH IMPEDANCE MATCHING NETWORKS THAT INCORPORATE A CAPACITOR INTEGRATED WITH A BOND PAD

(71) Applicant: FREESCALE SEMICONDUCTOR INC., Austin, TX (US)

(72) Inventors: Ibrahim Khalil, Munich (DE); Ebrahim M. Al Seragi, Mesa, AZ (US); Jeffrey K. Jones, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/187,376

(22) Filed: Jun. 20, 2016

(51) Int. Cl.
*H03F 3/195* (2006.01)
*H03F 1/56* (2006.01)

(52) U.S. Cl.
CPC ............. *H03F 1/56* (2013.01); *H03F 3/195* (2013.01); *H03F 2200/451* (2013.01)

(58) Field of Classification Search
USPC ................................................ 330/302–307
See application file for complete search history.

(56) References Cited

U.S. PATENT DOCUMENTS

| | | | |
|---|---|---|---|
| 7,190,083 B1 * | 3/2007 | Cave | H01L 23/48 257/728 |
| 7,564,303 B2 | 7/2009 | Perugupalli et al. | |
| 8,717,102 B2 | 5/2014 | Wilson et al. | |
| 2006/0038632 A1 | 2/2006 | Niu et al. | |
| 2015/0295547 A1 | 10/2015 | Blednov | |

* cited by examiner

*Primary Examiner* — Hieu Nguyen

(57) ABSTRACT

The embodiments described herein provide an amplifier device that utilizes bonding pad capacitance in an impedance matching network. In one specific embodiment, the amplifier device comprises: an amplifier formed on a semiconductor die, the amplifier including an amplifier input and an amplifier output, the amplifier configured to generate an amplified radio frequency (RF) signal at the amplifier output; and an impedance matching network coupled to the amplifier, the impedance matching network including a capacitor, where the capacitor includes a first plate, a second plate, and dielectric material between the first and second plates, where the first plate includes or is directly electrically coupled to a bond pad on the semiconductor die.

26 Claims, 10 Drawing Sheets

US 9,800,213 B1

AMPLIFIER DEVICES WITH IMPEDANCE MATCHING NETWORKS THAT INCORPORATE A CAPACITOR INTEGRATED WITH A BOND PAD

TECHNICAL FIELD

Embodiments of the subject matter described herein relate generally to amplifiers, and more particularly to radio frequency (RF) power amplifiers used in a variety of applications.

BACKGROUND

In general, amplifiers are used to increase the power of signals. For example, amplifiers can be used to convert low-power radio frequency (RF) signals into higher power RF signals for driving the antenna of a transmitter. In such cases, amplifiers may be implemented as part of an overall power amplifier used by an RF transmission system.

One common issue with amplifiers is bandwidth. For example, many amplifier designs with high theoretical power efficiencies may have characteristically lower fractional bandwidths, where the fractional bandwidth is the bandwidth of the amplifier divided by the center frequency of the amplifier. This can make it difficult to provide an amplifier with both high efficiency and high bandwidth.

A variety of factors can limit bandwidth in amplifiers. For example, parasitic and other capacitances can reduce the functional bandwidth of an amplifier. There remains a need for amplifiers that can provide relatively high bandwidths and low frequency gains.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein can provide semiconductor devices, and particularly amplifiers, that may have improved performance when compared with conventional devices. For example, the embodiments described herein include semiconductor devices that form portions of amplifiers that may be used in radio frequency (RF) applications. In general, the semiconductor devices described herein incorporate a capacitor integrated with a bond pad into an impedance matching network for the amplifier. As used herein, the term "bond pad capacitor" means a capacitor that includes a bond pad as a capacitor plate, or a capacitor that includes a capacitor plate that is directly electrically coupled with a bond pad. Incorporating a bond pad capacitor into an impedance matching network can reduce the negative effects of parasitic bond pad capacitance on the performance of the amplifier. In addition, implementing the bond pad capacitor into the impedance matching network can improve the bandwidth of the amplifier.

Figure 1:
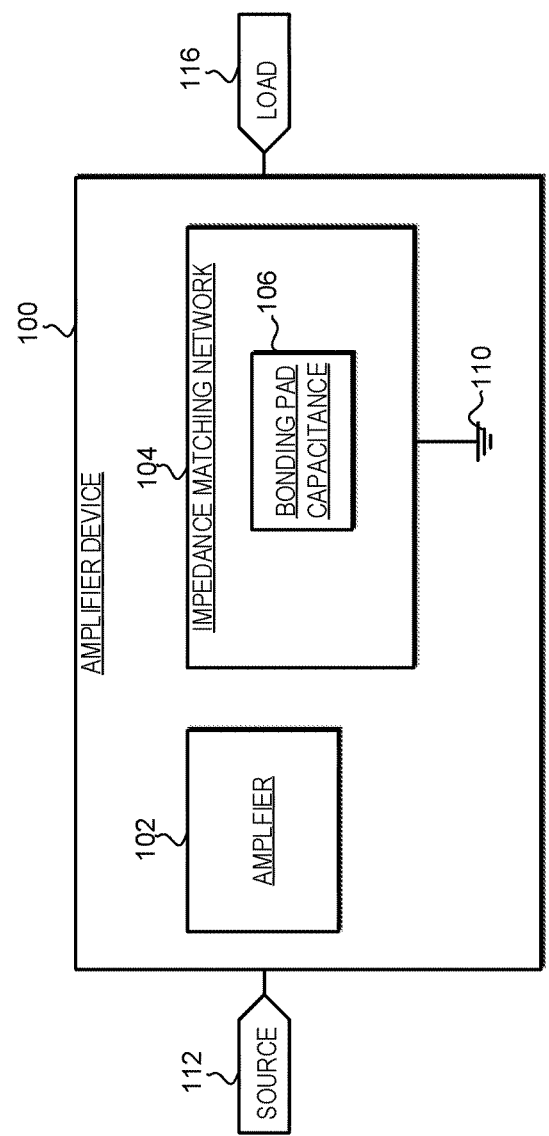
FIG. 1 is a schematic diagram of a portion of an amplifier device in accordance with an example embodiment.

Turning now to FIG. 1, a schematic diagram of a portion of an exemplary amplifier device 100 is illustrated. The amplifier device 100 includes an amplifier 102 and an impedance matching network 104. In accordance with the embodiments described herein, the impedance matching network 104 includes a bond pad capacitor 106. Specifically, the bond pad capacitor 106 is incorporated into the impedance matching network 104 in way that can enhance the performance of the amplifier device 100.

The amplifier 102 can be implemented with one or more single-stage or multi-stage power transistors formed in a semiconductor device. These transistors may be any suitable transistor type, including a field effect transistor (FET), such as a laterally-diffused metal oxide semiconductor (LDMOS) FET, which may be implemented using a gallium nitride (GaN), silicon, or gallium arsenide (GaAs) semiconductor device. In other embodiments, other types of transistor devices may be used (e.g., other types of FETs, bipolar junction transistors, and so on), which may be implemented using other types of semiconductor materials. For convenience, FET terminology will be used herein, such as describing a particular transistor as including a gate, source, and drain. Those of skill in the art would understand, based on the description herein, that a BJT implementation has analogous components.

During operation, the amplifier 102 receives an input signal from a signal source 112 (e.g., an RF signal source), and outputs an amplified signal through the impedance matching network 104 and to the load 116. For example, the RF signal source 112 may be electrically coupled to the gate of the amplifier transistor, the amplified signal may be produced at the drain (or source) of the amplifier transistor, and the source (or drain) may be coupled to a ground reference 110. The gate may be referred to herein as the "input" of the amplifier. Theoretically, either the drain or the source may function to produce the amplified signal. Although the below description discusses embodiments in which the drain produces the amplified signal, those of skill in the art would understand, based on the description herein, that the source alternatively may produce the amplified signal (and the drain may be coupled to the ground reference 110). Either way, the transistor region that produces the amplified signal may be referred to generally herein as the "output" of the amplifier transistor.

The impedance matching network 104 is designed and configured to facilitate efficient power transfer from the amplifier 102 to load the load 116 during such operation. To facilitate this, the impedance matching network 104 is coupled to the amplifier 102. As will be described below, in some embodiments the impedance matching network 104 comprises an output impedance matching network coupled to the amplifier 102 output. In other embodiments, the impedance matching network 104 comprises an input impedance matching network coupled to the amplifier 102 input. In either such embodiment, the impedance matching network 104 includes a bond pad capacitor 106, where the bond pad capacitor 106 is formed at least in part with a bond pad on a semiconductor die that includes the amplifier 102, and wherein the bond pad is physically connected to at least one bonding wire.

Furthermore, in some embodiments bond pad capacitor 106 can be configured in series with the amplifier 102 (i.e., with one capacitor plate coupled to the amplifier input or output, and the other capacitor plate coupled to the RF source 112 or the load 116). Specifically, the bond pad capacitor 106 can be configured in series with the amplifier 102 output or in series with the amplifier 102 input. Alternatively, the bond pad capacitor 106 can be configured between a ground 110 and the amplifier 102 output or between a ground 110 and the amplifier 102 input.

In addition to being configured as part the impedance matching network 104, the bond pad capacitor 106 can be configured to provide DC blocking to block a DC bias signal from reaching the ground. Stated another way, the bond pad capacitor 106 can be configured to additionally decouple a DC bias signal from the RF signal being amplified.

Typically, the amplifier 102 includes one or more transistors, where those transistors are formed on a semiconductor wafer, and that wafer is then singulated into individual dies. Each individual die can include the transistors for one or more amplifiers (e.g., amplifier 102), and elements of the impedance matching networks (e.g., impedance matching network 104). In accordance with the embodiments described herein, such dies will also include at least one bond pad, where the bond pad is used to couple to bond wires, and where the bond pad forms at least part of the bond pad capacitor 106. In an alternate embodiment, the amplifier 102 may be a "flip-chip" type of device, in which the electrical equivalent of a bond pad is referred to more simply as a "pad", and solder bumps or balls make the electrical connection to external circuitry (rather than using bond wires). Although the term "bond pad" is used extensively herein, it is to be understood that the term also encompasses flip chip pads or other electrically equivalent types of connections.

Such die(s) and other remaining elements of the impedance matching networks are then incorporated into a device package or directly coupled to a module substrate. In a packaged embodiment, the package encases the die(s) and associated components, and the package includes leads that provide the electrical connection to the encased dies and associated components. A typical package also includes structural components (e.g., including a flange or substrate) to which the die(s) and other primary electrical components are coupled. Electrical connections between the die(s), the other components, and the package leads can be provided by bond wires coupled to the bond pads or other suitable conductors. The package also may include an isolator that electrically isolates the package substrate or flange from the leads or alternatively may include encapsulation that provides such electrical isolation.

When completed, a packaged semiconductor device is a distinct device that may be mounted to a printed circuit board (PCB) or other suitable substrate, thus providing electrical connectivity to other components of an amplifier system. It should be noted that a typical package could include one or more amplifiers. Furthermore, such a package can include additional semiconductor devices and/or other components, including, for example, components of an impedance matching network coupled between the device's input lead and the input (e.g., the gate) of the transistor. Non-limiting examples of the type of packages that can be used include air cavity and over-molded packages. Furthermore, such packages can utilize a variety of different types of leads, such as gull wing leads, J-leads, pin grid arrays, ball grid arrays, land grid arrays, etc.

As stated above, the bond pad capacitor 106 is formed at least in part with a bond pad formed on a semiconductor die, where the bond pad is used to couple to bonding wires (or solder bumps or balls). As is known, a capacitor generally includes two conductive plates (or electrodes) that are separated by dielectric material. As one specific example, the bond pad capacitor 106 is formed in part with a bond pad that is formed in a first metallization layer, where this bond pad provides a first plate of the bond pad capacitor and where a second plate of the bond pad capacitor is formed in an underlying second metallization layer that is separated from the first metallization layer by dielectric material. In another specific embodiment, the bond pad capacitor is embodied as a capacitor that comprises a first capacitor plate formed in the first metallization layer, where the first capacitor plate is coupled to a bond pad in an underlying second metallization layer. In such an embodiment an opening in the semiconductor device is provided so that the bonding wires can be attached to the bond pad in the second metallization layer.

Figure 2:
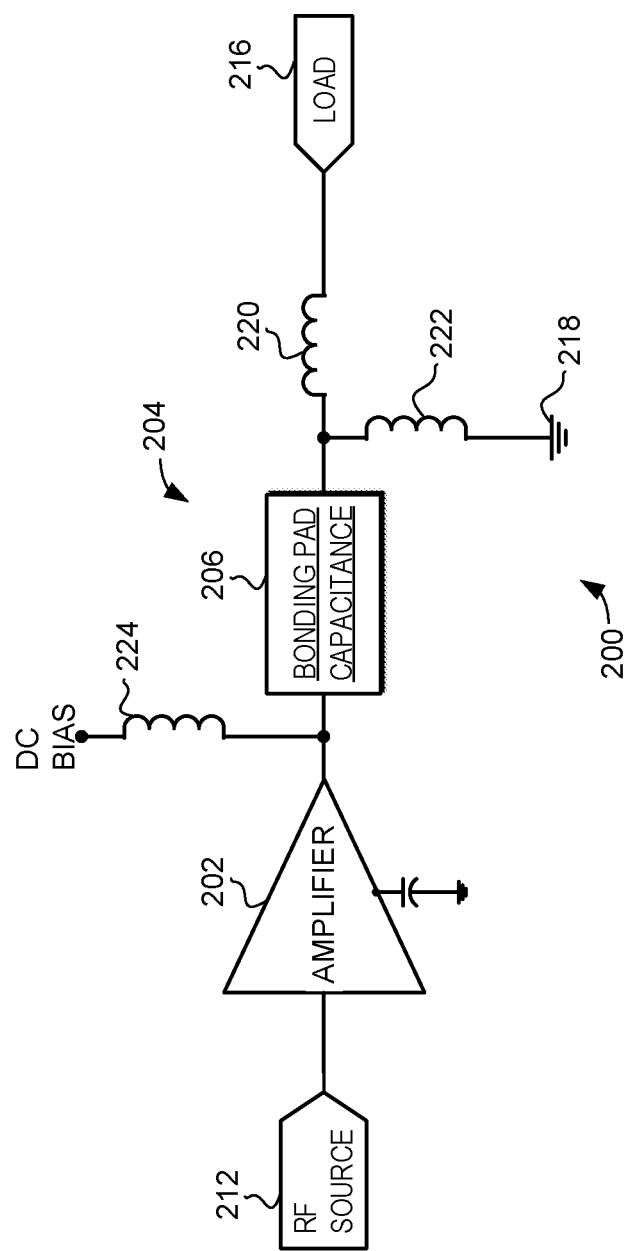
FIG. 2 is a schematic diagram of a portion of an amplifier device in accordance with an example embodiment.

Turning now to FIG. 2, a circuit diagram representing an exemplary amplifier device 200 is illustrated. The amplifier device 200 includes an amplifier 202 and an output impedance matching network 204. In accordance with the embodiments described herein, the output impedance matching network 204 includes a bond pad capacitor 206, and in this embodiment further includes a series inductance 220, a shunt inductance 222, and an additional inductance 224. Specifically, series inductance 220 is coupled between one plate of the bond pad capacitor 206 and a load 216. Likewise, shunt inductance 222 is coupled between one plate of the bond pad capacitor 206 and a ground reference 218. Finally, inductance 224 is coupled between one plate of the bond pad capacitor 206 and a DC bias voltage source.

Again, the amplifier 202 can be implemented with one or more transistors of any suitable type. During operation, the amplifier 202 receives an RF input signal at a signal source 212, and outputs an amplified signal through the output impedance matching network 204 and to the load 216.

In general, the bond pad capacitor 206 is incorporated into the output impedance matching network 204 so that the bond pad capacitor 206 does not degrade the performance of the amplifier device 200. Furthermore, in this embodiment the bond pad capacitor 206 is implemented to be in series with the amplifier 202 output, and is thus between the amplifier 202 output (e.g., the drain) and the load 216. Furthermore, in this embodiment, the bond pad capacitor 206 is implemented between a DC bias voltage source and the ground reference 218, and is thus implemented to provide DC blocking. In such an embodiment the bond pad capacitor 206 also serves to decouple the DC bias signal from the RF signal.

As will be described in detailed examples below, the bond pad capacitor 206 can be implemented with various metallization layers on a semiconductor die, where at least some of the metallization layers may be used to form one or more bond pads. Likewise, the inductances 220, 222, 224 can be implemented with various structures, including bonding wires, integrated passive devices (IPD) and discrete inductors.

Figure 3:
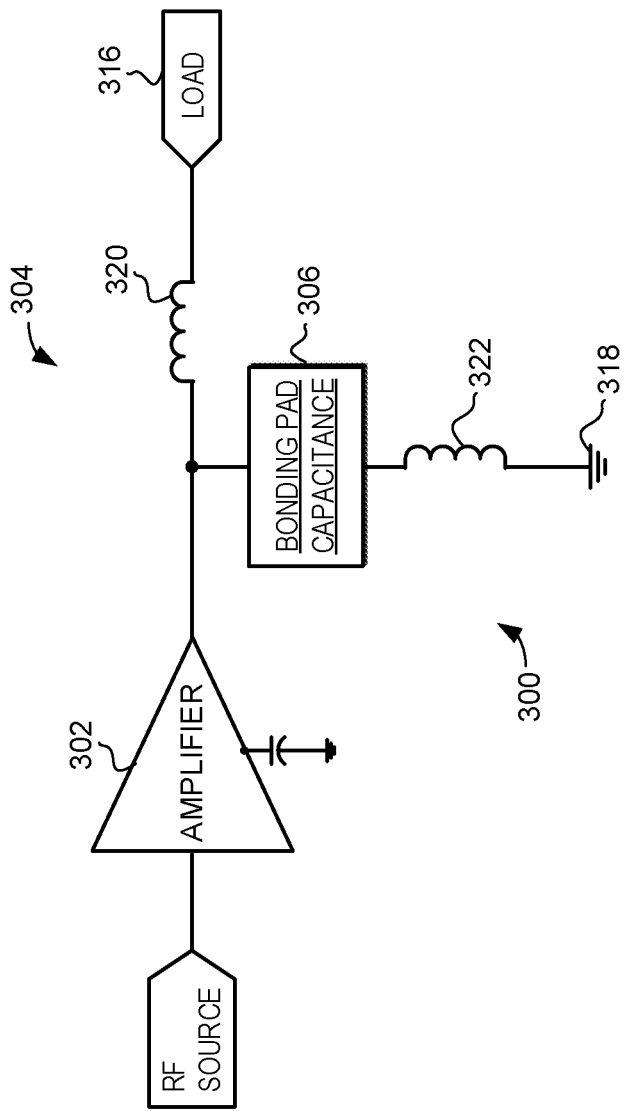
FIG. 3 is a schematic diagram of a portion of an amplifier device in accordance with an example embodiment.

Turning now to FIG. 3, a circuit diagram representing another exemplary amplifier device 300 is illustrated. The amplifier device 300 includes an amplifier 302 and an output impedance matching network 304. In accordance with the embodiments described herein, the output impedance matching network 304 includes a bond pad capacitor 306, and in this embodiment further includes a series inductance 320 and a shunt inductance 322. Specifically, in this embodiment the series inductance 320 is coupled between the amplifier 302 output and a load 316. Likewise, the shunt inductance 322 is coupled between one terminal of the bond pad capacitor 306 and a ground reference 318.

In general, the bond pad capacitor 306 is incorporated into the output impedance matching network 304 so that the bond pad capacitor 306 does not degrade the performance of the amplifier device 300. Furthermore, in this embodiment the bond pad capacitor 306 is implemented to be coupled in a series shunt circuit between the amplifier 302 output and the ground reference 318.

As will be described in detailed examples below, the bond pad capacitor 306 can be implemented with various metallization layers on a semiconductor die, where at least some of the layers may be used to form one or more bond pads. Likewise, the inductances 320 and 322 can be implemented with various structures, including bonding wires, integrated passive devices (IPD) and discrete inductors.

Figure 4:
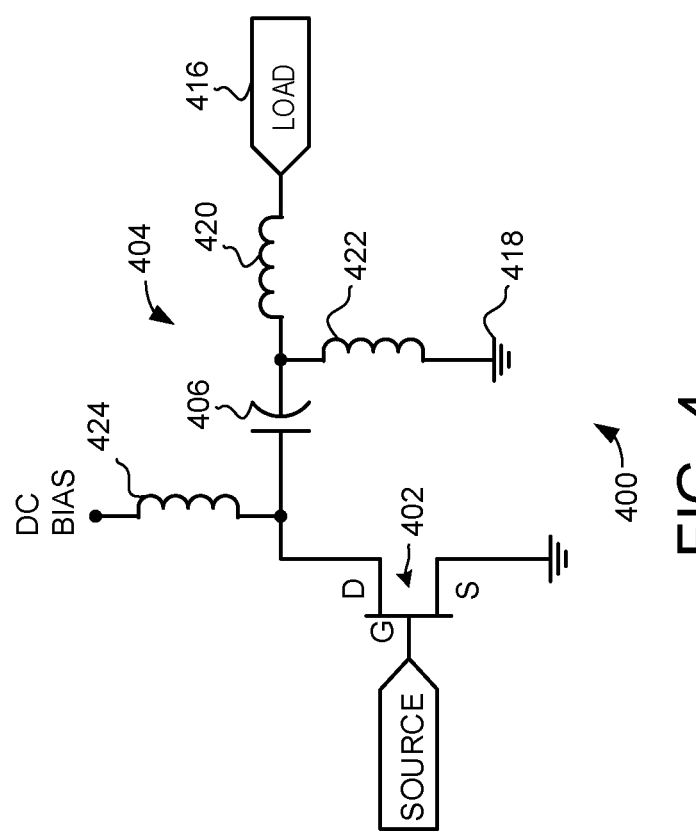
FIG. 4 is a circuit diagram of a portion of an amplifier device in accordance with an example embodiment.

Turning now to FIG. 4, a circuit diagram representing an exemplary amplifier device 400 is illustrated. The amplifier device 400 includes a transistor 402 (with gate, G, drain, D, and source, S, terminals) and an output impedance matching network 404. In accordance with the embodiments described herein, the output impedance matching network 404 includes a bond pad capacitor 406, and in this embodiment further includes a series inductance 420, a shunt inductance 422, and an additional inductance 424. The transistor 402 drain terminal (or the transistor output) is coupled to a first plate of the bond pad capacitor 406. The series inductance 420 is coupled between a second plate of the bond pad capacitor 406 and a load 416. Likewise, the shunt inductance 422 is coupled between the second plate of the bond pad capacitor 406 and a ground reference 418. It should be noted that in this illustrated embodiment the bond pad capacitor 406 is implemented to be in series with the transistor 402 output.

As was described above, the bond pad capacitor 406 can be implemented with various metallization layers on a semiconductor die, where some of the layers may be used to form one or more bond pads. Likewise, the inductances 420 and 422 can be implemented with various structures, including bonding wires, integrated passive devices (IPD) and discrete inductors.

Figure 5:
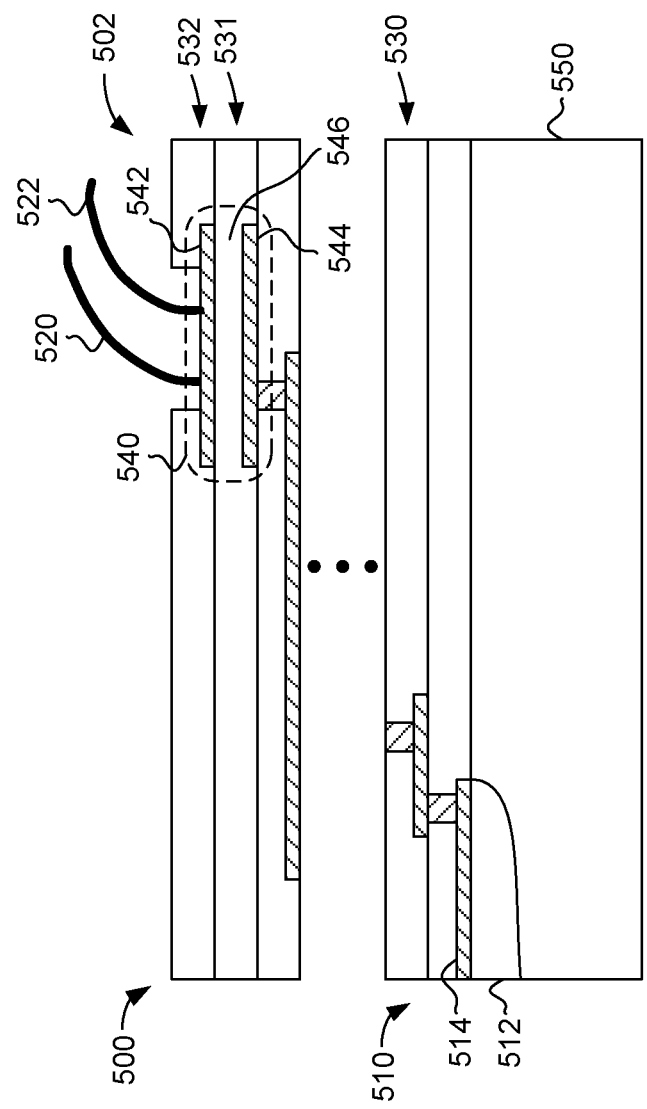
FIG. 5 is a side, cross-sectional view of a portion of a device that includes an impedance matching network in accordance with an example embodiment.

Turing to FIG. 5, a cross-sectional, side view of a portion of a semiconductor device 500 that includes a portion of an impedance matching network 502 is illustrated. Specifically, the impedance matching network 502 is one exemplary implementation of the impedance matching network 404 illustrated in FIG. 4. The semiconductor device 500 includes a transistor 510 formed in a semiconductor substrate 550. The transistor 510 includes a gate (not shown), a source region (not shown), and a drain region 512, to which a drain contact 514 is coupled. A plurality of alternating conductive (or metallization) layers and dielectric layers are formed (or built up) overlying a surface of the semiconductor substrate 550. An arbitrary number of conductive and dielectric layers may be built up over the substrate 550, as indicated by the ellipses between the central layers. As an example, the description herein will describe a structure that includes five metallization layers, with the "lowest" metallization layer 530 closest to the substrate 550 referred to as the M1 layer, and the "highest" metallization layer 532 farthest from the substrate 550 (and closest to the top surface of the device 500) referred to as the "bonding" or "copper" layer (although the highest metallization layer 532 may include materials in addition to or other than copper). The "intermediate" M5 layer 531 (underlying the bonding layer 532) also will be specifically referred to herein. Although specific layer designations are used herein, those of skill in the art would understand, based on the description herein, that more or fewer layers alternatively may be used.

The impedance matching network 502 includes a capacitor 540 implemented at least in part with a portion of a first metallization layer 532 (e.g., the bonding layer), where that portion is referred to as a first capacitor plate 542, a portion of an underlying second metallization layer 531 (e.g., the M5 layer), where that portion is referred to as a second capacitor plate 544, and dielectric material 546 (e.g., an oxide, nitride, or other dielectric material) positioned between the first and second capacitor plates 542, 544. According to an embodiment, the first capacitor plate 542 also functions as a bond pad to which bond wires 520, 522 may be attached. Also included in the impedance matching network 502 are inductances implemented with the bond wires 520 and 522. Specifically, the first capacitor plate 542 and the second capacitor plate 544 are example structures that show how capacitor 406 (FIG. 4) could be implemented, and bond wires 520 and 522 are likewise examples of how inductances 420 and 422 (FIG. 4) could be implemented.

In this illustrated example, both the first capacitor plate 542 and the second capacitor plate 544 can be formed in corresponding metallization layers 531, 532 formed over a semiconductor wafer, and the dielectric material 546 may be formed from a portion of a dielectric layer positioned between the metallization layers. For example, in a typical embodiment, the metallization layers are formed in back-end wafer processing that is used to form horizontal and vertical interconnects between devices on a semiconductor die, and these metallization layers can be formed to additionally include bond pads. Such bond pads are typically implemented to provide connections to the associated devices (e.g., transistor 402 of FIG. 4) through the horizontal and vertical interconnects. Specifically, the bond pads provide a structure for bond wires to physically connect to, and those bond wires can then be used to connect to other devices, including other dies inside the package, or to package leads for connection outside the package. For example, using ball bonding, wedge bonding, or compliant bonding techniques, the bond wires can be attached to the bond pads to provide the physically connection between the bond pads and bond wires.

In the specific example of FIG. 5, the first capacitor plate 542 and the second capacitor plate 544 are formed from different metallization layers 531, 532. More specifically, the first capacitor plate 542 can be formed in the "highest" or bonding layer 532 (e.g., a copper metallization layer, commonly referred to as the CU layer) and the second capacitor plate 544 can be formed in an underlying layer 531 (e.g., the M5 layer).

In accordance with the embodiments described herein, the capacitor 540 is coupled to an amplifier (e.g., transistor 402) in a way that makes the associated capacitance part of the impedance matching network 502. In this illustrated embodiment, the first capacitor plate 542 and the second capacitor plate 544 are implemented such that the associated capacitance is in series with the amplifier output. Specifically, the second capacitor plate 544 is coupled to the amplifier output (e.g., transistor drain contact 514) through conductive vias and traces in the build-up layers between the second capacitor plate 544 and the amplifier output. In addition, the second capacitor plate 544 is electrically coupled to the DC bias source through an inductor (e.g., inductor 424, not shown in FIG. 5). The first capacitor plate 542 is coupled to the load (e.g., load 416) through bond wires 520. Likewise, the first capacitor plate 542 is coupled to the ground reference (e.g., ground reference 418) through bond wires 522. When so implemented the capacitance associated with the first capacitor plate 542 and the second capacitor plate 544 become part of the impedance matching network.

It should be noted by controlling the areas of the first capacitor plate 542 and/or the second capacitor plate 544, the amount of overlap between the first capacitor plate 542 and the second capacitor plate 544, and the thickness and dielectric constant of the dielectric material 546, the amount of capacitance provided by the capacitor can be controlled. For example, the first and second capacitor plates 542, 544 may have lengths in a range of about 50 microns to about 500 microns, widths in a range of about 1000 microns to about 10,000 microns, although their lengths and widths may be greater or smaller, as well. Further, the dielectric constant of the dielectric material 546 may be in a range of about 3.0 to about 9.0, although the dielectric constant may be greater or smaller, as well. Finally, the thickness of the dielectric material 546 may be in a range of about 2.0 microns to about 5.0 microns, although the thickness may be greater or smaller, as well. Likewise, by controlling the size, shape and number of bond wires, the inductance values of the bond wires 520 and 522 can be controlled. By controlling such capacitances and inductances an effective impedance matching network can be provided.

Figure 6:
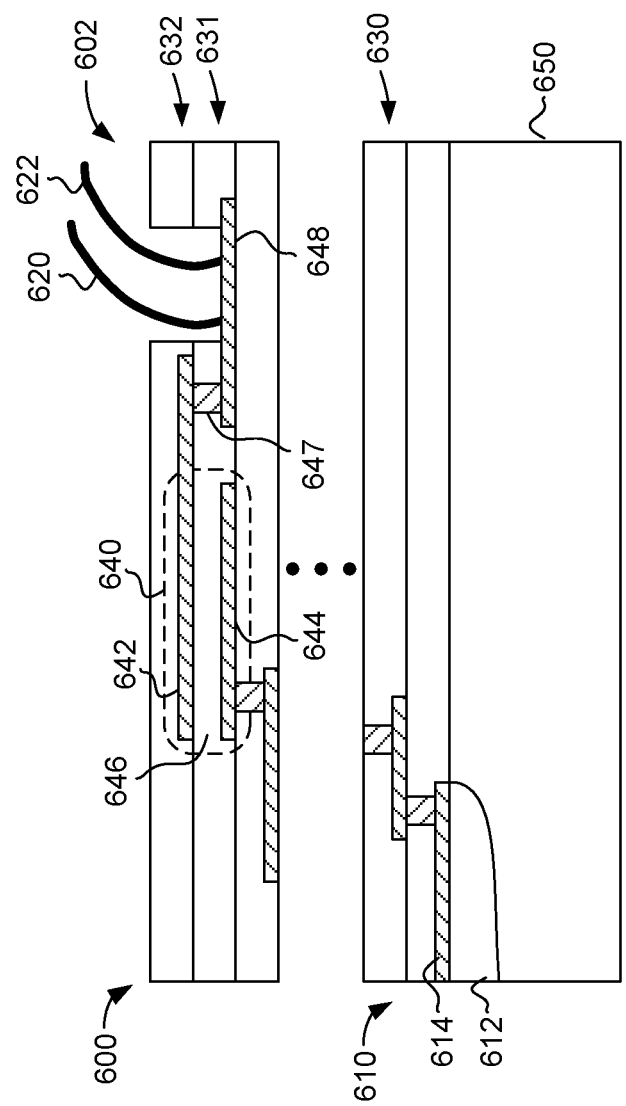
FIG. 6 is a side, cross-sectional view of a portion of a device that includes an impedance matching network in accordance with an example embodiment.

Turing to FIG. 6, cross-sectional, side view of a portion of a semiconductor device 600 that includes a portion of another impedance matching network 602 is illustrated. Again, the impedance matching network 602 is one exemplary implementation of the impedance matching network 404 illustrated in FIG. 4. The semiconductor device 600 includes a transistor 610 formed in a semiconductor substrate 650. The transistor 610 includes a gate (not shown), a source region (not shown), and a drain region 612, to which a drain contact 614 is coupled. An arbitrary number of alternating conductive (or metallization) layers and dielectric layers are formed (or built up) overlying a surface of the semiconductor substrate 650, with the lowest metallization layer 630 closest to the substrate 650, and the highest metallization layer 632 farthest from the substrate 650.

The impedance matching network 602 includes a capacitor 640 implemented at least in part with a first capacitor plate 642, a second capacitor plate 644, dielectric material 646, and a bond pad 648. Also included in the impedance matching network 602 are inductances implemented with bond wires 620 and 622. Specifically, the first capacitor plate 642, the second capacitor plate 644 and bond pad 648 are example structures that show how capacitor 406 (FIG. 4) could be implemented, and bond wires 620 and 622 are likewise examples of how inductances 420 and 422 (FIG. 4) could be implemented.

Again, the first capacitor plate 642, the second capacitor plate 644, and bond pad 648 can be formed in corresponding metallization layers 631, 632 formed on a semiconductor wafer. In the specific example of FIG. 6, the second capacitor plate 644 and the bond pad 648 are formed from the same metallization layer 631, while the first capacitor plate 642 is formed on a different metallization layer 632.

In this illustrated embodiment, the capacitor plates 642, 644 and bond pad 648 are implemented such that the associated capacitance is in series with the amplifier output. Specifically, the second capacitor plate 644 is electrically coupled to the amplifier output (e.g., transistor drain contact 614) through conductive vias and traces in the build-up layers between the second capacitor plate 644 and the amplifier output. In addition, the second capacitor plate 644 is electrically coupled to the DC bias source through an inductor (e.g., inductor 424, not shown in FIG. 6). The first capacitor plate 642 is coupled to the load (e.g., load 416) through conductive via 647, an additional portion of metallization layer 631 that forms a bond pad, and bond wires 620. Likewise, the first capacitor plate 642 is coupled to the ground reference (e.g., ground reference 418) through bond wires 622. When so implemented the capacitance associated with the first capacitor plate 642 and the second capacitor plate 644 become part of the impedance matching network.

Again, the area and overlap of the various capacitor plates 642, 644, and the thickness and dielectric constant of the dielectric material 646 can be configured to provide a desired capacitance. Likewise, the size, shape and number of bond wires can be configured to provide the desired inductances. By controlling such capacitances and inductances an effective impedance matching network can be provided.

Figure 7:
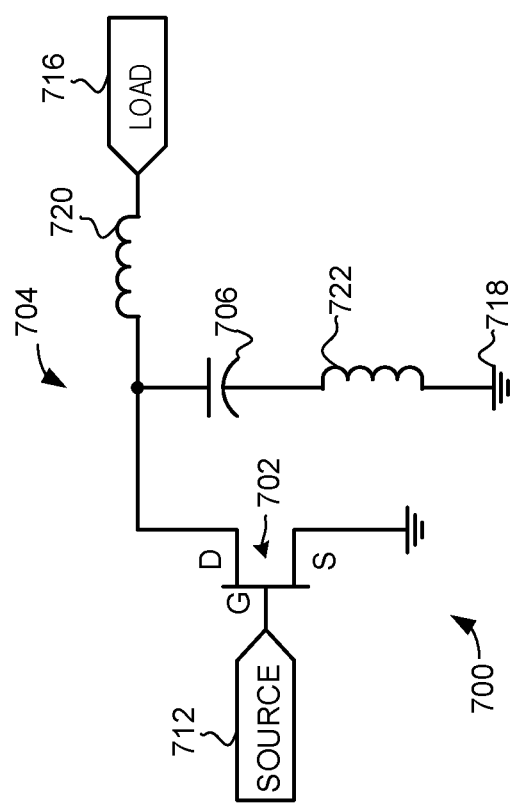
FIG. 7 is a circuit diagram of a portion of an amplifier device in accordance with an example embodiment.

Turning now to FIG. 7, a circuit diagram representing an exemplary amplifier device 700 is illustrated. The amplifier device 700 includes a transistor 702 and an output impedance matching network 704. In accordance with the embodiments described herein, the output impedance matching network 704 includes a shunt bond pad capacitor 706, and in this embodiment further includes a series inductance 720 and a shunt inductance 722. The series inductance 720 is coupled between a first plate of the bond pad capacitor 706 and a load 716. Likewise, the shunt inductance 722 is coupled between a second plate of the bond pad capacitor 706 and a ground reference 718. The bond pad capacitor 706 and the shunt inductance 722 form a series circuit between the transistor 702 and the ground reference 718. It should be noted that in this illustrated embodiment the bond pad capacitor 706 is implemented to be in a shunt circuit between the transistor 702 output and the ground 718 reference. As such, the capacitor 706 can provide DC blocking to block a DC bias signal from reaching the ground 718. Stated another way, the bond pad capacitor 706 can be configured to additionally decouple a DC bias signal from the RF signal being amplified.

As was described above, the bond pad capacitor 706 can be implemented with various metallization layers on a semiconductor die used to form one or more bond pads. Likewise, the inductances 720 and 722 can be implemented with various structures, including bonding wires, integrated passive devices (IPD) and discrete inductors.

Figure 8:
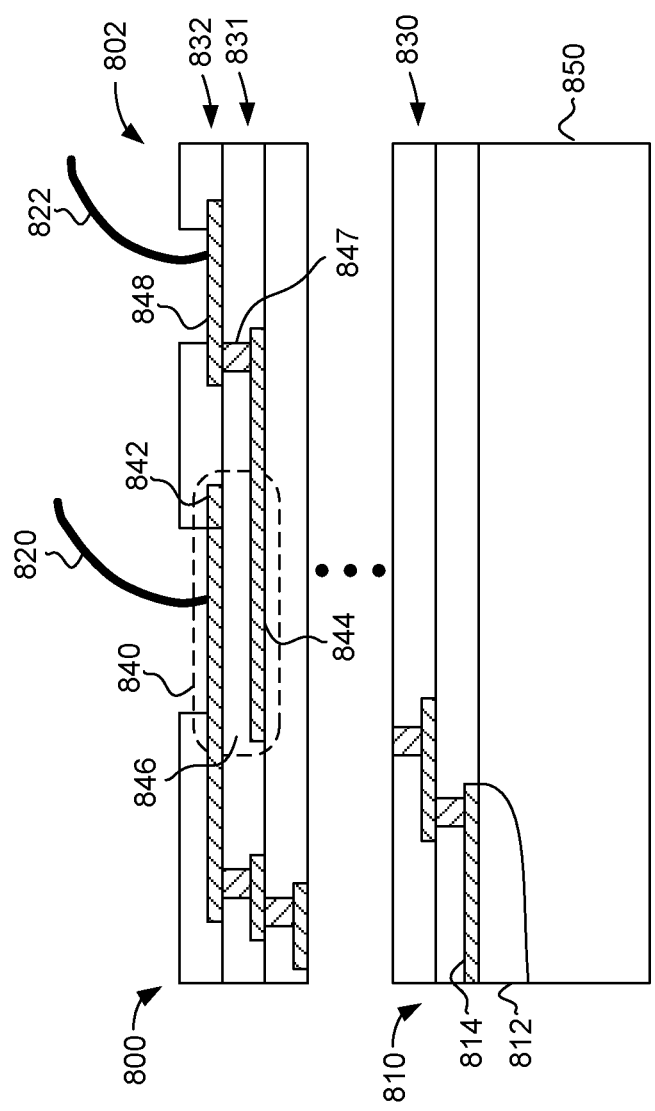
FIG. 8 is a side, cross-sectional view of a portion of a device that includes an impedance matching network in accordance with an example embodiment.

Turing to FIG. 8, cross-sectional, side view of a portion of a semiconductor device 800 that includes a portion of another impedance matching network 802 is illustrated. Specifically, the impedance matching network 802 is one exemplary implementation of the impedance matching network 704 illustrated in FIG. 7. The semiconductor device 800 includes a transistor 810 formed in a semiconductor substrate 850. The transistor 810 includes a gate (not shown), a source region (not shown), and a drain region 812, to which a drain contact 814 is coupled. An arbitrary number of alternating conductive (or metallization) layers and dielectric layers are formed (or built up) overlying a surface of the semiconductor substrate 850, with the lowest metallization layer 830 closest to the substrate 850, and the highest metallization layer 832 farthest from the substrate 850.

The impedance matching network 802 includes a bond pad capacitor 840 implemented at least in part with a first capacitor plate 842, a second capacitor plate 844, dielectric material 846, and a bond pad 848. Also included in the impedance matching network 802 are inductances implemented with bond wires 820 and 822. Specifically, the capacitor plates 842 and 844 are example structures that show how capacitor 706 (FIG. 7) could be implemented, and bond wires 820 and 822 are likewise examples of how inductances 720 and 722 (FIG. 4) could be implemented.

Like the previous examples, the capacitor plates 842, 844 in this example can be formed in corresponding metallization layers 831, 832 formed on a semiconductor wafer. In the specific example of FIG. 8, the second capacitor plate 844 is formed on a different metallization layer than the first capacitor plate 844 and the bond pad 848. More specifically, in this illustrated embodiment the second capacitor plate 844 can be formed in the fourth metallization layer 831 (commonly referred to as the M4 layer) while the first capacitor plate 842, which also may function as a bond pad, and bond pads 848 may be formed in the fifth metallization layer 832 (commonly referred to as the M5 layer) or in the bonding layer.

In accordance with the embodiments described herein, the capacitor plates 842, 844 are coupled to an amplifier (e.g., transistor 702) in a way that makes the associated capacitance part of the impedance matching network 802. In this illustrated embodiment, the capacitor plates 842, 844 are implemented such that the resulting bond pad capacitor 840 is between the amplifier output and ground. As such, in addition to being configured as part the impedance matching network 704, the capacitor plates 842, 844 are configured to provide DC blocking to block a DC bias signal from reaching the ground.

Specifically, the first capacitor plate 842, which is a bond pad in an embodiment, is electrically coupled to the amplifier output (e.g., transistor drain contact 814) through conductive vias and traces in the build-up layers between the second first capacitor plate 842 and the amplifier output. The first capacitor plate 842 also is coupled to the load (e.g., load 716) through bond wires 820. The second capacitor plate 844 is coupled to the ground reference (e.g., ground reference 718) through conductive via 847, an additional portion of metallization layer 832 that forms bond pad 848, and bond wires 822. When so implemented the capacitance associated with the first capacitor plate 842 and the second capacitor plate 844 become part of the impedance matching network and further provides DC blocking.

Again, by controlling the area and overlap of the capacitor plates 842, 844, and the thickness and dielectric constant of the dielectric material 846, the amount of capacitance provided by the capacitor plates can be controlled. Likewise, by controlling the size, shape and number of bond wires the inductance of the bond wires 820 and 822 can be controlled. By controlling such capacitances and inductances an effective impedance matching network can be provided.

Figure 9:
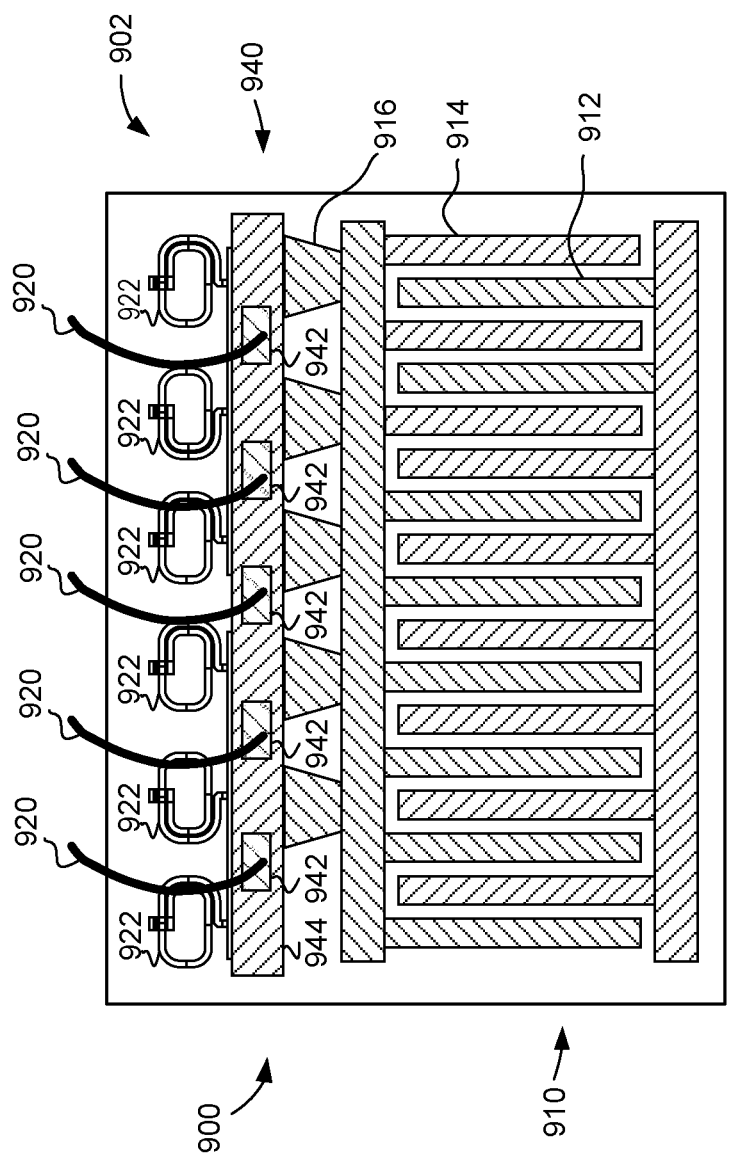
FIG. 9 is a top view of a portion of a device that includes an impedance matching network in accordance with an example embodiment.

Turing to FIG. 9, a top view of a portion of a semiconductor die 900 that includes another embodiment of an impedance matching network 902 is illustrated. Again, the impedance matching network 902 is one exemplary implementation of the impedance matching network 704 illustrated in FIG. 7. In this illustrated embodiment, the impedance matching network 902 is illustrated as formed in part on a semiconductor die 900, upon which the various components have been formed or attached. In addition to the impedance matching network 902, the semiconductor die also may include a transistor 910 to which the impedance matching network 902 is electrically coupled. The transistor 910 includes a gate (implemented in part with gate contact fingers 912), a source region (not shown), and a drain region (not shown) to which drain contact fingers 914 are coupled. Although transistor 910 is shown unobscured in FIG. 9, an arbitrary number of alternating conductive (or metallization) layers and dielectric layers are formed (or built up) overlying the transistor 910, with the lowest metallization layer closest to the substrate, and the highest metallization layer farthest from the substrate.

The impedance matching network 902 includes a bond pad capacitor 940 implemented at least in part with a first capacitor plate 942, a second capacitor plate 944, and dielectric material between the capacitor plates 942, 944. Also included in the impedance matching network 902 are inductances implemented with bond wires 920 and integrated inductors 922.

Specifically, the capacitor plates 942 and 944 are example structures that show how capacitor 706 (FIG. 7) could be implemented. Likewise, bond wires 920 are examples of how inductance 720 (FIG. 7) could be implemented, and integrated inductors 922 are examples of how inductances 722 (FIG. 7) could be implemented.

Again, the first capacitor plate 942 and the second capacitor plate 944 are formed in corresponding metallization layers formed on a semiconductor wafer. In this illustrated embodiment, the second capacitor plate 944 is formed from a portion of the highest metallization layer, and openings are formed through the second capacitor plate 944 and the underlying dielectric material, and these openings allow the bond wires 920 to pass through and be physically connected to the underlying capacitor plate 942.

In this illustrated embodiment, a first capacitor plate 942, which includes multiple bond pads, is coupled to the amplifier output (e.g., transistor 910 drain fingers 914) through feeds 916 within the build-up structure. The second capacitor plate 944 is coupled to the ground reference (e.g., ground reference 718) through the integrated inductors 922. The integrated inductors 922 may be formed within one or more of the metallization layers overlying the semiconductor substrate, where first ends of the inductors 922 are coupled to the second capacitor plate 944, and second ends of the inductors 922 are coupled with through substrate vias to a ground reference plane on the bottom of the semiconductor substrate. When so implemented the capacitor 940 associated with the first capacitor plate 942 and second capacitor plate 944 becomes part of the impedance matching network and further provides DC blocking to block a DC bias signal from reaching the ground.

As was described above, in some embodiments the impedance matching network that includes a bond pad capacitor can be implemented as an output impedance matching network coupled to an amplifier output. Examples of such embodiments were illustrated in FIGS. 2-4 and 7. In other embodiments, the impedance matching network can be implemented as an input impedance matching network coupled to an amplifier input (e.g., to a gate terminal of the amplifier transistor). Thus, a bond pad capacitor can be implemented as part of an input impedance matching network.

Figure 10:
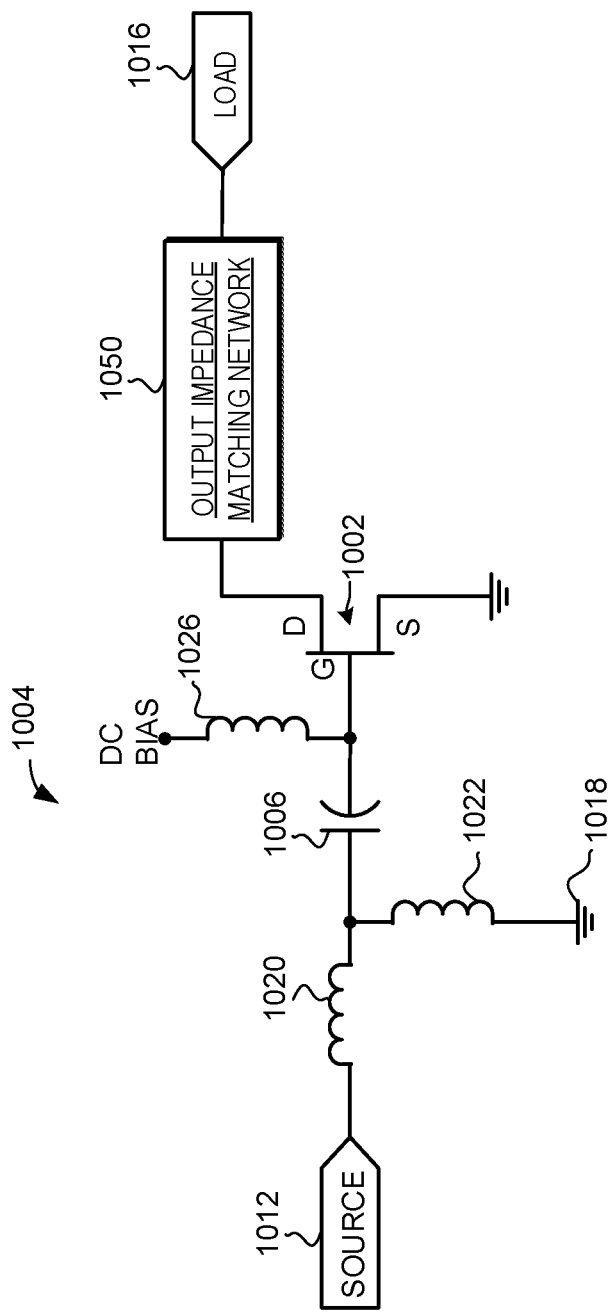
FIG. 10 is a circuit diagram of a portion of an amplifier device in accordance with an example embodiment.

Turning now to FIG. 10, a circuit diagram representing an exemplary amplifier device 1000 is illustrated. The amplifier device 1000 includes a transistor 1002, an input impedance matching network 1004, and an output impedance matching network 1050. It should be noted that in such an implementation the output impedance matching network 1050 can comprise any of the various embodiments described above, or any other suitable output impedance matching network.

In this illustrated embodiment, the input impedance matching network 1004 includes a bond pad capacitor 1006, and series and shunt inductances 1020 and 1022. Specifically, the bond pad capacitor 1006 is coupled between the RF signal source 1012 and the transistor 1002 input (e.g., gate terminal). The series inductance 1020 is coupled between the RF signal source 1012 and a first plate of the bond pad capacitor 1006. A second plate of the bond pad capacitor 1006 is coupled to the gate of the transistor 1002. Likewise, the shunt inductance 1022 is coupled between the first plate of the bond pad capacitor 1006 and a ground reference 1018. Together, these elements implement the input impedance matching network 1004. In addition, an additional inductance 1026 is coupled between a DC bias source and the transistor 1002 input.

It should be noted that in this illustrated embodiment the bond pad capacitor 1006 is implemented to be in series with the transistor 1002 input. However, this is just one example, and in other implementations the bond pad capacitor 1006 of the input impedance matching network 1004 could be implemented in shunt between the transistor 1002 input and the ground reference 1018, similar to the output impedance matching network illustrated in FIG. 7.

When configured as part of an input impedance matching network 1004, the bond pad capacitor 1006 can be implemented with various metallization layers on a semiconductor die using to form one or more capacitor plates. Likewise, the inductances 1020, 1022 and 1026 can be implemented with various structures, including bonding wires, integrated passive devices (IPD) and discrete inductors.

In one embodiment, an amplifier device is provided, the amplifier device comprising: an amplifier formed on a semiconductor die, the amplifier including an amplifier input and an amplifier output, the amplifier configured to generate an amplified radio frequency (RF) signal at the amplifier output; and an impedance matching network coupled to the amplifier, the impedance matching network including a capacitor, where the capacitor includes a first plate, a second plate, and dielectric material between the first and second plates, where the first plate includes or is directly electrically coupled to a bond pad on the semiconductor die.

In another embodiment, an amplifier device is provided, the amplifier device comprising: a device package including at least one output lead and at least one input lead, the device package encasing at least one semiconductor die; an amplifier formed on the semiconductor die, the amplifier including an amplifier input and an amplifier output, the amplifier configured to generate an amplified radio frequency (RF) signal at the amplifier output; and a bond pad formed on the semiconductor die, the bond pad coupled to the amplifier, and the bond pad forming at least part of a capacitor, where the capacitor is part of an impedance matching network for the amplifier; and bonding wires physically connected to the bond pad.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier device comprising:
   an amplifier formed on a semiconductor die, the amplifier including an amplifier input and an amplifier output, the amplifier configured to generate an amplified radio frequency (RF) signal at the amplifier output; and
   an impedance matching network formed on the semiconductor die and coupled to the amplifier internal to the semiconductor die, the impedance matching network including a bond pad capacitor formed on the semiconductor die, where the bond pad capacitor includes a first plate formed on the semiconductor die, a second plate formed on the semiconductor die, and dielectric material between the first and second plates, where the first plate includes or is directly electrically coupled to a bond pad on the semiconductor die.

2. The amplifier device of claim 1, wherein the impedance matching network comprises an output impedance matching network, and wherein the bond pad capacitor is coupled in series between the amplifier output and a load.

3. The amplifier device of claim 1, wherein the impedance matching network comprises an input impedance matching network, and wherein the bond pad capacitor is coupled in series between the amplifier input and a signal source.

4. The amplifier device of claim 1, wherein the impedance matching network comprises an output impedance matching network, and wherein the bond pad capacitor is coupled in shunt between a ground reference and the amplifier output.

5. The amplifier device of claim 1, wherein the impedance matching network comprises an input impedance matching network, wherein the bond pad capacitor is coupled in shunt between a ground reference and the amplifier input.

6. The amplifier device of claim 1, wherein the bond pad capacitor further provides DC blocking to block a DC bias signal from reaching a ground reference.

7. The amplifier device of claim 1, wherein the bond pad capacitor further decouples a DC bias signal from the RF signal.

8. The amplifier device of claim 1, wherein the bond pad is formed in a first metallization layer, and wherein the first plate of the bond pad capacitor comprises the bond pad, and wherein the second plate of the bond pad capacitor is formed in a second metallization layer.

9. The amplifier device of claim 8, wherein the first plate is formed in a first metallization layer, and wherein the first plate is coupled to the bond pad in a second metallization layer via a vertical interconnect.

10. The amplifier device of claim 1, wherein the bond pad provides the first plate of the bond pad capacitor, and wherein a DC bias source is coupled to the second plate of the bond pad capacitor.

11. The amplifier device of claim 1, wherein the bond pad provides the first plate of the bond pad capacitor, and wherein the first plate of the bond pad capacitor is coupled to a device output through bonding wires.

12. The amplifier device of claim 1, wherein the bond pad provides the first plate of the bond pad capacitor, and wherein the first plate of the bond pad capacitor is coupled to a ground reference through a first inductance.

13. The amplifier device of claim 1, wherein the bond pad provides the first plate of the bond pad capacitor, and wherein the second plate of the bond pad capacitor is coupled to a ground reference through a first inductance.

14. An amplifier device comprising:
a device package including at least one output lead and at least one input lead, the device package encasing at least one semiconductor die;
an amplifier formed on the semiconductor die, the amplifier including an amplifier input and an amplifier output, the amplifier configured to generate an amplified radio frequency (RF) signal at the amplifier output; and
a bond pad capacitor including a first plate formed on the semiconductor die, a second plate formed on the semiconductor die, and a bond pad formed on the semiconductor die, the bond pad coupled to the amplifier, where the bond pad capacitor is part of an impedance matching network for the amplifier; and
bonding wires physically connected to the bond pad.

15. The amplifier device of claim 14, wherein the impedance matching network comprises an output impedance matching network, and wherein the bond pad capacitor is coupled in series between the amplifier output and a load.

16. The amplifier device of claim 14, wherein the impedance matching network comprises an input impedance matching network, and wherein the bond pad capacitor is coupled in series between the amplifier input and a signal source.

17. The amplifier device of claim 14, wherein the impedance matching network comprises an output impedance matching network, and wherein the bond pad capacitor is coupled in shunt between a ground reference and the amplifier output.

18. The amplifier device of claim 14, wherein the impedance matching network comprises an input impedance matching network, wherein the bond pad capacitor is coupled in shunt between a ground reference and the amplifier input.

19. The amplifier device of claim 14, wherein the bond pad capacitor further provides DC blocking to block a DC bias signal from reaching a ground reference.

20. The amplifier device of claim 14, wherein the bond pad capacitor further decouples a DC bias signal from the RF signal.

21. The amplifier device of claim 14, wherein the bond pad is formed in a first metallization layer, and wherein the bond pad provides the first plate of the bond pad capacitor, and wherein the second plate of the bond pad capacitor is formed in a second metallization layer.

22. The amplifier device of claim 21, wherein the first plate is formed in a first metallization layer, and wherein the first plate is coupled to the bond pad in a second metallization layer via a vertical interconnect.

23. The amplifier device of claim 14, wherein the bond pad provides the first plate of the bond pad capacitor, and wherein the second plate of the bond pad capacitor is coupled to a DC bias source.

24. The amplifier device of claim 14, wherein the bond pad provides the first plate of the bond pad capacitor, and wherein bonding wires are further coupled between the bond pad and a device output.

25. The amplifier device of claim 14, wherein the bond pad provides the first plate of the bond pad capacitor, and wherein the first plate of the bond pad capacitor is coupled to a ground reference through a first inductance.

26. The amplifier device of claim 14, wherein the bond pad provides the first plate of the bond pad capacitor, and wherein the second plate of the bond pad capacitor is coupled to a ground reference through a first inductance.

* * * * *